United States Patent [19]
Sutton

[11] 3,947,758
[45] Mar. 30, 1976

[54] DISC THERMOSTAT TEST SYSTEM AND METHOD

[75] Inventor: Walter T. Sutton, Lexington, Ky.

[73] Assignee: Texas Instruments Incorporated, Dallas, Tex.

[22] Filed: May 14, 1974

[21] Appl. No.: 469,721

Related U.S. Application Data

[63] Continuation of Ser. No. 317,481, Dec. 21, 1972, abandoned.

[52] U.S. Cl. ................. 324/28 R; 73/1 F; 337/344; 137/554
[51] Int. Cl.² ........................................ G01R 31/02
[58] Field of Search.... 324/158 MG, 158 SM, 28 R, 324/28 CB, 34 D; 73/1 F; 337/343, 344; 236/94; 137/554; 200/73, 83 S

[56] References Cited
UNITED STATES PATENTS

| | | | |
|---|---|---|---|
| 2,375,859 | 5/1945 | Marcy | 337/344 |
| 3,286,166 | 11/1966 | Lockyer | 324/28 R |
| 3,326,087 | 6/1967 | Gohlke | 137/554 |

OTHER PUBLICATIONS

Sensitive output Idicator for D.T.D.D., D. Wobschall, Rev. Sci. Instruments, Vol. 32, No. 1, 1/61, pp. 71–73.

*Primary Examiner*—R. V. Rolinec
*Assistant Examiner*—Michael J. Tokar
*Attorney, Agent, or Firm*—John A. Haug; James P. McAndrews; Russell E. Baumann

[57] ABSTRACT

The disclosure relates to a system and method whereby bimetallic discs as well as a completed thermostat can be dynamically tested non-destructively. The bimetallic disc can be tested by utilizing its magnetic properties, the magnetic properties of the disc being sensed by a magnetic transducer under operating conditions to provide a velocity curve of disc movement. The thermostat is tested in the same manner as the disc with simultaneous monitoring of the electrical switch controlled by the disc to insure operation thereof at the ideal point on the disc velocity curve.

13 Claims, 5 Drawing Figures

| CIRCUIT ARRANGEMENT | CURVES | MEASUREMENT | APPLICATION |
|---|---|---|---|
| (a) AMP SCOPE DIFFERENTIATOR | VOLTS vs TIME ACCELERATION | DISC ACCELERATION $A = k_3 V = \frac{dV}{dT}$ | USED TO DETERMINE AT WHAT TIME OR DISTANCE IN DISC MOVEMENT OR VELOCITY THAT MAXIMUM POWER OR ENERGY CAN BE EXTRACTED FROM DISC |
| (b) AMP SCOPE VELOCITY | VOLTS vs TIME VELOCITY | DISC VELOCITY $V = kV$ | USED AS A FACTOR IN DETERMINING OR CALCULATING DISC KINETIC ENERGY |
| (c) AMP SCOPE INTEGRATOR | VOLTS vs TIME DISTANCE | DISTANCE MOVED BY DISC $D = k_2 V = \int V dT$ | USED TO ESTABLISH FREE DISC SNAP RANGE AND BASE GAUGE |
| (d) | | KINETIC ENERGY OF DISC $E = \tfrac{1}{2} MV^2$ | USED TO ESTABLISH THE ENERGY TO DO THE WORK ON THE LOAD |
| (e) | | POWER DEVELOPED BY DISC $P = \frac{E}{T}$ $P \propto VA$ | USED TO ESTABLISH THAT THE WORK CAN BE DONE IN A SELECTED TIME |

Fig. 2.

DISC THERMOSTAT TEST SYSTEM AND METHOD

This application is a continuation of Ser. No. 317,481, filed Dec. 21, 1972, and now abandoned.

This invention relates to a method and system for on-line, dynamic, non-destructive testing of bimetallic discs and disc thermostats and more specifically, to a method and system for magnetically detecting the movement of a thermostatic disc and electrical switch to test the thermostatic disc as well as disc type thermostats.

Present day techniques for testing of bimetallic disc type thermostats as well as the bimetallic disc themselves has been very slow and cumbersome and often required destructive testing. Present day thermostats of the bimetallic disc type are normally tested by periodically removing one from a production line and destructively testing it to determine, on a statistical basis, the quality of the thermostats being produced. Bimetallic discs are tested as to temperature by slowly raising the surrounding temperature until the disc snaps and, in this way, determining the snapping temperature of the disc. Testing of this type is of long duration. Prior art testing techniques for thermostats have tested the thermostatic switches by placing a battery across the electrical terminals to determine when there was a current flow therethrough. Systems of this type are really measuring an on or off condition. Due to the low voltage on the battery relative to the normal working conditions of the switches, there was no testing for air gap in the switch. In fact, under higher voltage conditions, the switch might actually fail to provide an open circuit and provide arcing with subsequent quick deterioration of the electrical switch contacts.

In accordance with the present invention, there is provided a dynamic, on-line, non-destructive testing method and apparatus for testing bimetallic discs as well as disc thermostats which provide a quick and accurate determination of bimetallic disc action including the sensing of a trapped disc, creep and double snap, base gauge, an estimated value of contact pressure, a forecast of device life expectancy, contact bounce, estimated temperature differential and variation in construction such as cup materials by a simple on-line magnetic testing method and apparatus. This testing can be done on-line and can provide one hundred percent testing procedures rather than the above-described periodic testing measures of the prior art.

Briefly, in accordance with the present invention, a bimetallic thermostatic disc or thermostat is positioned over a heating device which provides uniform constant temperature of predetermined value, a magnet surrounded by a coil being positioned in magnetic coupling relationship with the discs so that movement of the disc will be sensed by the magnet and coil and a curve thereof can be displayed on an oscilloscope or other similar device to provide an indication of the velocity curve of the disc during the snapping action thereof. In normal thermostats, since movement of the disc causes movement of a transfer pin which in turn causes the opening and/or closing of a switch, the switch opening and/or closing can also be viewed in a time relationship with the movement of the disc to determine the relationships between disc movement and switch movement. The information thereby obtained can be utilized in a manner to be described to sense all of the above indicated parameters for evaluation of bimetallic discs or disc thermostats, to evaluate their quality and efficiency as well as to provide the capability of on-line correction in the event certain ones of the above parameters are showing values below some minimum value for efficient operation of the device.

It is therefore an object of this invention to provide a method and apparatus for testing disc thermostats and the disc on-line and non-destructively.

It is a further object of this invention to provide a method and apparatus for magnetically sensing the movement of a thermostatic disc.

It is a yet further object of this invention to provide a method and apparatus for rapidly testing disc thermostats on-line for disc action, contact pressure and bounce and estimated life expectancy.

The above objects and still further objects of the invention will immediately become apparent to those skilled in the art after consideration of the following preferred embodiment thereof, which is provided by way of example and not by way of limitation, wherein:

FIG. 2 is a chart of circuit arrangements for obtaining specified measurements from the testing apparatus of FIG. 1.

When a disc thermostat is placed in contact with a magnetically biased coil and heated to its snap temperature the disc movement will alter the magnetic field in the coil and produce an output voltage proportional to the disc movement or velocity. This output voltage, related to disc velocity, plus the thermostat switch operation can be simultaneously displayed on a storage type oscilloscope.

Performance parameters of the disc thermostat can be ascertained from the graph displaying the time period in which the disc velocity curve is altered by the loading of the thermostat switch.

The amplitude of the graph (sensor output voltage) is propostional to the disc velocity; the higher the velocity the higher the output voltage. The area under the curve is an indication of the power developed by the disc, and deflections in the curve are indications of the loading or damping of the disc velocity caused by operating the thermostat switch. Should the switch action occur in the low velocity area of the curve, slow switch operation and low power operation of the switch will result, indicating a potential creep switch action and failure.

Figure 1:
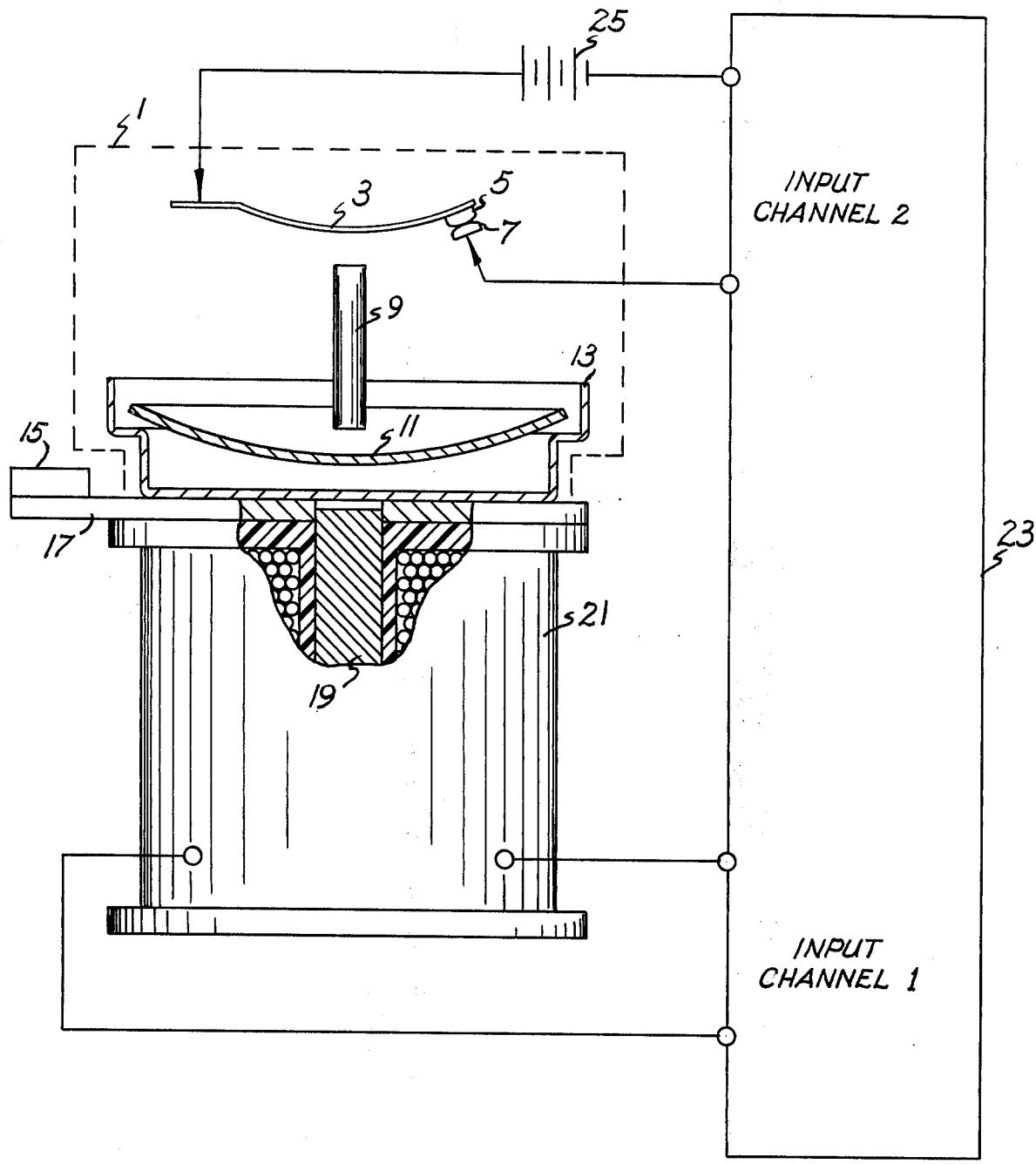
FIG. 1 is a drawing of a testing apparatus in accordance with the present invention.

The above is provided by utilizing a testing system as set forth in FIG. 1. In FIG. 1 there is shown a thermostat 1 under test, the thermostat including a switch arm 3 having a contact 5 for contacting terminal 7. The switch arm 3 in FIG. 1 is biased to be in the closed position as shown and is moved to the open position by upward travel of the transfer pin 9. The transfer pin 9 in turn rests on a snap action disc 11 of well known type, the disc 11 resting in the cup 13. The snapping of the disc 11 causes the upward travel of the transfer pin 9. The thermostat 1 is now to be tested as described above by the use of the remaining apparatus as will now be described.

The disc 11 is caused to snap to its downwardly cupped state when its temperature reaches some predetermined value as designed into the disc. Accordingly, there is provided a PTC heater 15 of well known type which provides a temperature at or slightly above the snapping temperature of the disc. The heater 15 is positioned on a thermal conductor 17 which is positioned proximate the disc 11 and beneath the cup 13 in order to transfer heat from the thermal conductor 17 to the disc 11. The thermal conductor 17 has an aperture therein through which a magnet 19 extends, the magnet being positioned within a coil 21. The output of coil 21 is fed to a first input channel of an oscilloscope 23. A second input channel of the oscilloscope 23 is connected to a battery 25 and the switch arm 3 via contacts 5 and 7.

In operation, the disc 11 is heated to the snapping temperature by the heater 15 via the thermal conductor 17. As the disc 11 begins its upward movement, the change in magnetic field caused by such movement (the disc 11 having magnetic properties) is sensed by the coil 21 and provides a graph on the oscilloscope 23 of the sensed change in magnetic field. As shown in FIG. 2(b), the display on the oscilloscope is proportional to the velocity of the disc 11. When the transfer pin 9 has been moved upwardly to the point where the contacts 5 and 7 become separated, this change will be displayed on channel 2 of the oscilloscope in time relation to the movement of disc 11. Any arcing between contacts 5 and 7 or bounce of switch arm 3 will be displayed on channel 2.

Referring now to FIG. 2, it can be seen from FIG. 2(a) that the acceleration of the disc 11 can easily be computed by the placement of an amplifier and differentiator between the output of the coil 21 and the input to channel 1 of the oscilloscope 23. Also, the distance travelled by the disc 11 can be computed by the placement of an amplifier and integrator between the output of the coil 21 and the input to channel 1 of the oscilloscope 23 as shown in FIG. 2(c). The velocity of the disc 11, as stated previously, is provided as a direct amplified output from the coil 21 to the oscilloscope 23. It is also clear from FIG. 2(d) that the kinetic energy of the disc 11 can be measured if the mass (M) thereof is known and the disc velocity is known from FIG. 2(b). Also, the power developed by the disc 11 can be obtained as shown in FIG. 2(e) once the energy has been computed as shown in FIG. 2(d) or from measurement of disc velocity and disc acceleration as shown in FIGS. 2(a) and 2(b).

Figure 3A:
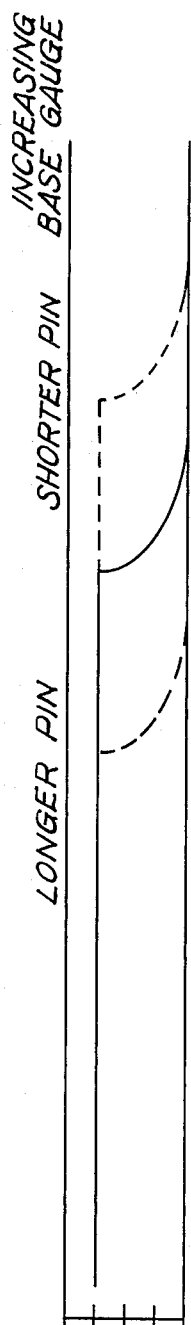
FIG. 3 is a diagram equating actual disc and switch position to measured values thereof in accordance with the present invention.
Figure 3B:
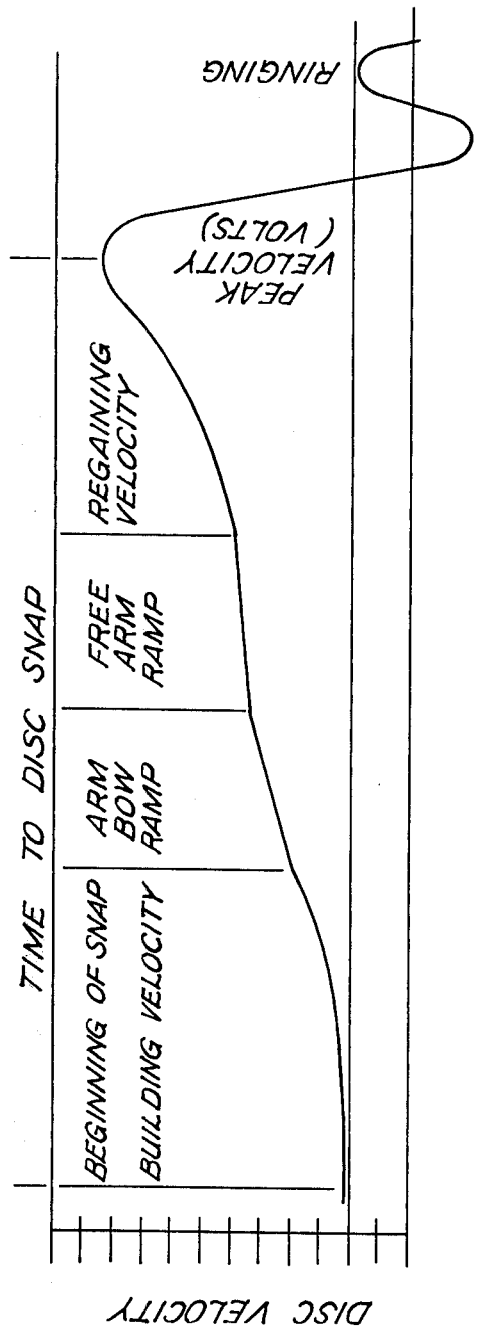
Figure 3C:
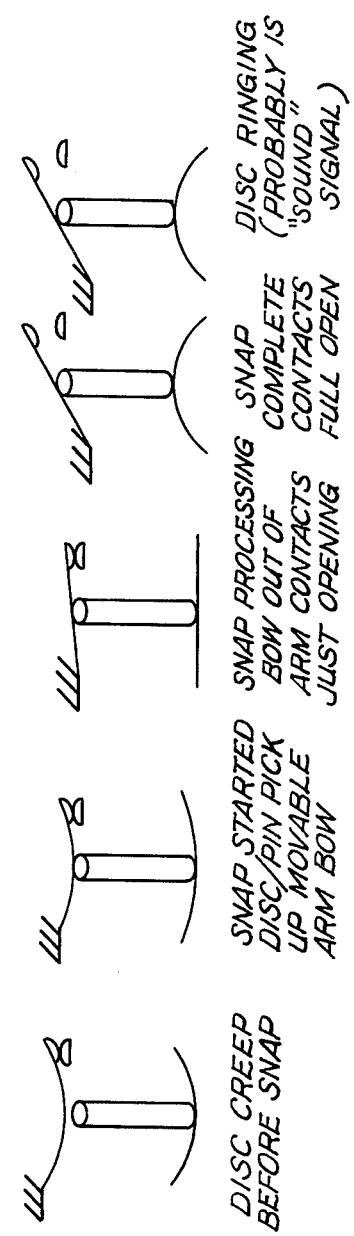

With reference to FIG. 3, FIG. 3(a) shows the graph at channel 2 of the oscilloscope 23 for operation of switch arm 3 with respect to time, FIG. 3(b) shows the graph of the velocity of the disc 11 with respect to time and FIG. 3(c) is a diagrammatic view of the position of the disc, transfer pin and switch arm at selected times during a snapping cycle of the disc. The graphs of FIGS. 3(a) and 3(b) have the same time base.

It can be seen by reference to FIG. 3 that the disc 11 will initially begin to creep prior to snapping and this will be displayed in the velocity curve of FIG. 3(b) as "beginning of snap-building velocity", the switch being closed as shown in FIG. 3(c). As the disc starts to snap, the transfer pin moves against the switch arm, the velocity of the disc increasing but the switch still being closed. As the disc snap progresses, the contacts 5 and 7 start to part but the current is still passing through the switch. The disc snapping then is completed with disc velocity again increasing after a falling off, it being seen that the current through the switch quickly dropped off to zero shortly after the contacts 5 and 7 began to open. Finally, the disc starts to "ring" in the snapped state, the switch remaining open.

It can be seen that, in addition to the measurements set forth in FIG. 2 it can be determined whether the transfer pin is too long or too short depending upon when the switch starts to open. This is shown in dotted lines in FIG. 3(a). It can also be determined whether there is contact bounce since such bounce would appear in FIG. 3(a) as a plurality of dots when current through the switch goes on and off after the initial switch opening. Also, the speed of switching from "on" to "off" is seen by the fall off of the curve of FIG. 3(a) and this speed can be increased by adjusting the length of the transfer pin to open the switch at the point in the velocity curve of most favorable velocity. It is therefore apparent that various essential disc thermostat and disc parameters are readily measurable on-line, non-destructively and at electronic speeds.

With particular reference to FIG. 3(b) a comparison of the ringing portion of the disc velocity curve with a known standard of mechanical resonance will enable one to determine if the geometry of the disc has changed in any way, as by having an edge crimped or a crack develop in the disc. Should such a crack develop in the disc the ringing portion of the curve will show a more rapid damping of the disc.

Although the above-described embodiment has been described with reference to an entire switch assembly the characteristics of a free disc can also be measured by placing the disc in a suitable support and causing the disc to snap. A standard free disc velocity curve can then be used against which test discs can be measured. Without the pin and contact arm of the switch assembly the curve will include a more pronounced ringing portion when compared to the curve shown in FIG. 3(b).

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of testing and adjusting a thermostat having a snap acting disc displaying magnetic properties, a switch and a transfer pin urged by said disc to operate said switch, comprising the steps of
    a. providing a velocity graph on electronic storage means with respect to time for said disc during snapping thereof,
    b. providing a graph on electronic storage means with respect to time of switch operation of said thermostat during snapping of said disc, and
    c. adjusting the operation of said switch relative to time in response to said graphs in (a) and (b).

2. A method as set forth in claim 1, wherein step (c) comprises adjusting the length of a transfer pin of said thermostat.

3. A system for testing and adjusting a thermostat having a snap action disc having magnetic properties, a transfer pin and a switch operated by movement of said transfer pin in response to movement of said disc, comprising,
    a. heater means for heating said disc to its snapping temperature,
    b. a magnetic transducer responsive to movement of said disc to provide an indication of said disc movement and c. storage means for storing the indication of said disc movement.

4. A system as set forth in claim 3 further including a second storage means and a source of voltage coupled between said second storage means and said switch whereby operation of said switch is stored in said second storage means.

5. A system as set forth in claim 3 wherein said heater means is positioned proximate and in heat coupling relation to said disc.

6. A system as set forth in claim 4 wherein said heater means is positioned proximate and in heat coupling relation to said disc.

7. A system as set forth in claim 5 wherein said heater means includes an aperture therein adjacent said disc, said magnetic transducer extending through said aperture.

8. A system as set forth in claim 6 wherein said heater means includes an aperture therein adjacent said disc, said magnetic transducer extending through said aperture.

9. A system as set forth in claim 7 wherein said magnetic transducer includes a magnet and a coil surrounding said magnet, said magnet extending through said aperture.

10. A system as set forth in claim 8 wherein said magnetic transducer includes a magnet and a coil surrounding said magnet, said magnet extending through said aperture.

11. A method of testing a switch having a snap acting disc displaying magnetic properties comprising the steps of
   a. providing a velocity graph on electronic storage means with respect to time for said disc during snapping thereof, and
   b. comparing the velocity graph against a known standard to determine operational characteristics of the switch.

12. A method of testing a snap acting disc displaying magnetic properties, comprising the steps of
   a. providing a velocity graph on electronic storage means with respect to time for said disc during snapping thereof, and
   b. comparing the velocity graph against a known standard to determine operational characteristics of the disc.

13. A method according to claim 12 in which the velocity graph includes a portion after the disc has snapped and a change in disc geometry can be determined by comparing the said portion of the velocity graph with the known standard.

* * * * *